United States Patent
Michael et al.

(10) Patent No.: US 8,467,906 B2
(45) Date of Patent: Jun. 18, 2013

(54) LOAD BALANCING TASKS IN A DATA CENTER BASED ON PRESSURE DIFFERENTIAL NEEDED FOR COOLING SERVERS

(75) Inventors: Amir Meir Michael, San Mateo, CA (US); Michael Paleczny, San Jose, CA (US)

(73) Assignee: Facebook, Inc., Menlo Park, CA (US)

( * ) Notice: Subject to any disclaimer, the term of this patent is extended or adjusted under 35 U.S.C. 154(b) by 256 days.

(21) Appl. No.: 12/854,062

(22) Filed: Aug. 10, 2010

(65) Prior Publication Data
US 2012/0041600 A1  Feb. 16, 2012

(51) Int. Cl.
*G05B 13/00* (2006.01)

(52) U.S. Cl.
USPC .................................. 700/276; 711/1; 165/67

(58) Field of Classification Search
USPC .................................. 700/276; 711/1; 165/67
See application file for complete search history.

(56) References Cited

U.S. PATENT DOCUMENTS

| | | | | |
|---|---|---|---|---|
| 2002/0194251 A1* | 12/2002 | Richter et al. | | 709/105 |
| 2003/0046396 A1* | 3/2003 | Richter et al. | | 709/226 |
| 2005/0044301 A1* | 2/2005 | Vasilevsky et al. | | 711/1 |
| 2005/0120160 A1* | 6/2005 | Plouffe et al. | | 711/1 |
| 2005/0225936 A1* | 10/2005 | Day | | 361/687 |
| 2007/0136311 A1* | 6/2007 | Kasten et al. | | 707/10 |
| 2007/0183129 A1* | 8/2007 | Lewis et al. | | 361/724 |
| 2007/0213000 A1* | 9/2007 | Day | | 454/184 |
| 2009/0168345 A1* | 7/2009 | Martini | | 361/691 |
| 2009/0173473 A1* | 7/2009 | Day | | 165/67 |
| 2011/0083824 A1* | 4/2011 | Rogers | | 165/80.2 |

* cited by examiner

*Primary Examiner* — Mohammad Ali
*Assistant Examiner* — Anthony Whittington
(74) *Attorney, Agent, or Firm* — Fenwick & West LLP

(57) ABSTRACT

In a data center that cools servers using an airflow from a central fan, rather than individual server fans, the cooling needs for each server are met by creating a sufficient pressure differential across each server. Because the pressure differential is the same for all of the servers, it is desirable to operate the data center such that each server needs the same pressure differential for proper cooling. Accordingly, a load balancer assigns tasks to the servers based on the known cooling needs of each server in order to balance the pressure differential needed to cool the server. This information may also be sent to the central fan to ensure that a sufficient pressure is created by the fan. Determining the cooling needs beforehand avoids spikes in server temperature, thereby enabling the servers to operate safely at a temperature closer to their maximum rated temperatures.

22 Claims, 2 Drawing Sheets

| WORK/SEC | POWER | CFM | PRESSURE DIFFERENCE |
|----------|-------|-----|---------------------|
| 10K | 300W | 85 | 0.075 |
| 5K | 250W | 65 | 0.050 |
| 2K | 200W | 45 | 0.020 |
| ⋮ | ⋮ | ⋮ | ⋮ |

LOAD BALANCING TASKS IN A DATA CENTER BASED ON PRESSURE DIFFERENTIAL NEEDED FOR COOLING SERVERS

BACKGROUND

This invention relates generally to data centers, and more particularly to efficient cooling of computing devices within a data center.

Heat removal is a prominent factor in computer system and data center design. The number of servers deployed in a data center has steadily increased while the increase in server performance has increased the heat generated by the electronic components in the servers during operation. Because the reliability of servers used by the data center decreases if they are permitted to operate at a high temperature over time, a portion of the data center's power is used for cooling electronics in the servers. As the number or servers included in a data center increases, a greater portion of the power consumed by the data center is used to cool electronics within the server.

Conventionally, the servers in the data center are individually equipped with a cooling system to dissipate heat produced during operation. Commonly, each server includes a fan to dissipate heat generated by the server during operation. However, these internal fans generally consume about 10%-15% of the power used by the servers, and they also produce heat during operation, thereby limiting the ability of these fans to dissipate heat.

Additionally, in conventional configurations, an internal server fan is initiated to cool the server when the server temperature reaches a threshold temperature. As the server temperature is dependent upon the number of data processing requests, data retrieval requests, data storage requests or other requests processed by the server, the number of requests processed by a server are limited so that a temperature spikes during processing of requests does not cause the server to exceed the threshold temperature. Hence, operation of conventional internal fans impairs server performance by placing an upper bound on the number of requests that can be processed by a server.

SUMMARY

Embodiments of the invention balance the number of requests, or "load," processed by a plurality of servers and use an external cooling supply to cool servers within a data center. Hence, embodiments of the invention reduce or eliminate the need for internal fans to cool servers in a data center, at least under normal operating conditions, and dynamically adjust the number of requests processed by various servers to avoid large variations in the temperature of different servers. In one embodiment, a data center includes a cold aisle adjacent to one side of a set of server that that receives cold air from a cooling system. An exhaust system included in a hot aisle adjacent to a second side of the servers directs air from the hot aisle outside of the data center, causing the hot aisle to have a pressure less than the pressure of the cold aisle. This pressure difference between the cold aisle and the hot aisle causes cold air to flow from the cold aisle through the servers to the hot aisle, thereby cooling the electronic components in the servers (and heating the air flow). For example, a fan included in the hot aisle extracts heated air from the hot aisle and directs the heated air outside of the data center.

In one embodiment, one or more sensors monitor the pressure of the hot aisle and the pressure of the cold aisle and calculate a pressure difference between the hot aisle and the cold aisle. Additionally, the one or more sensors may also monitor air flow proximate to the servers. A load balancer receives requests for processing by one or more servers from one or more devices and also receives the calculated pressure difference. For a plurality of servers in the data center, the load balancer includes data associating a workload with a pressure difference. For example, data stored in the load balancer identifies a maximum workload capable of being processed by a server for a pressure difference without increasing the temperature of a server beyond a threshold temperature. In one embodiment, the load balancer includes a table associating a workload with a pressure difference for each server in the data center. In a different embodiment, the load balancer includes a table associating a maximum workload with a pressure difference for different types or models of servers included in the data center. Based on the calculated pressure difference and the maximum workload associated with the pressure difference for each server, the load balancer determines a number of requests for communication to different servers. For example, based on the maximum workload associated with the calculated pressure difference, the load balancer directs requests to various servers to maximize the number of requests processed by different servers without increasing server temperature above a threshold amount.

In an embodiment, a cold air supply unit that is external to the servers, such as a fan, supplies the cold air to the cold aisle from a cooling system to contribute the pressure difference between the cold aisle and the hot aisle. The heated air from the hot aisle may be cooled and then recirculated through the cold aisle, or the cool air may be obtained elsewhere, such as ambient air.

The Figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Data Center Architecture

Figure 1:
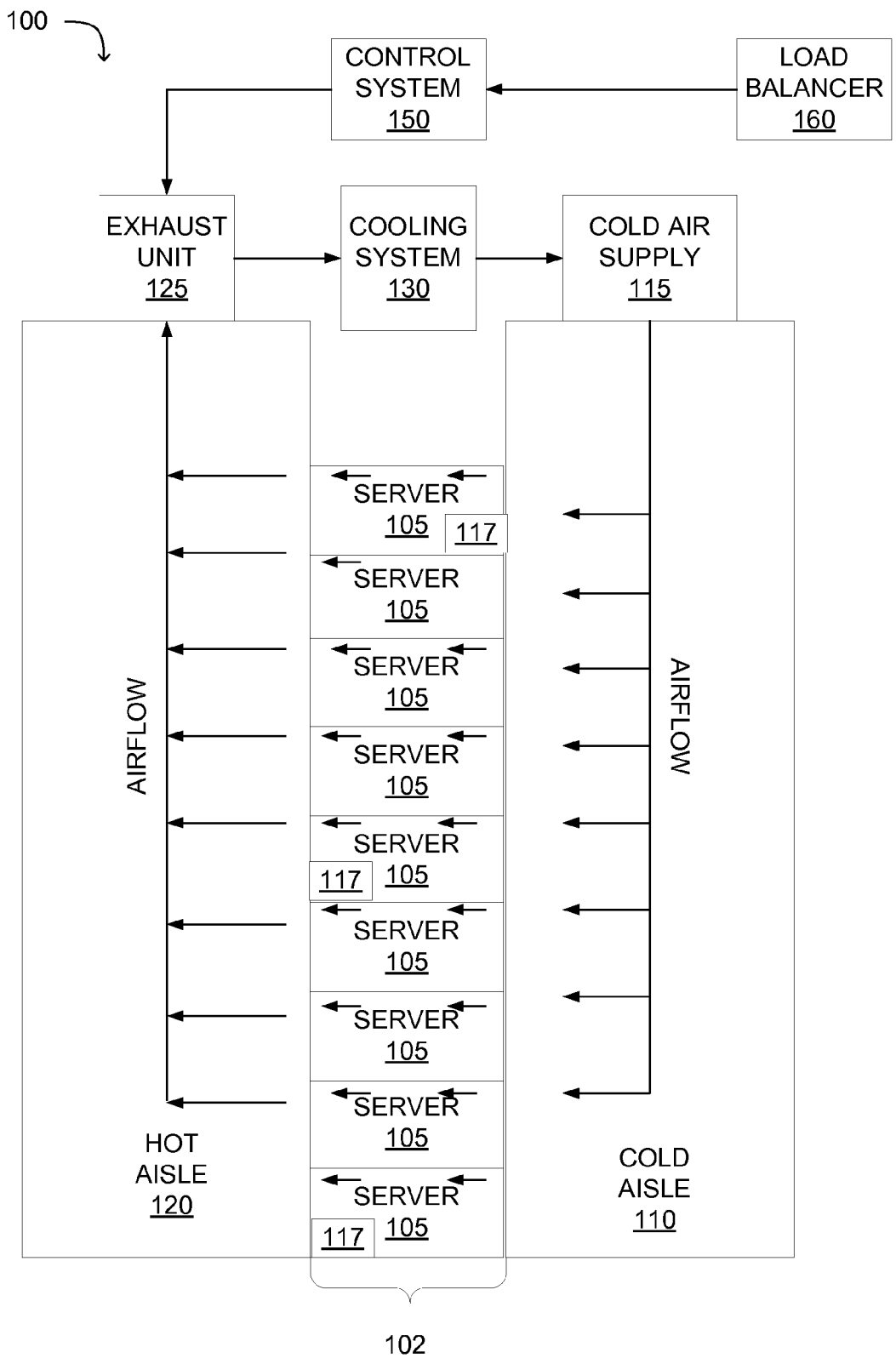
FIG. 1 is a side view of a data center for cooling servers without relying on internal fans showing airflow throughout the data center in accordance with an embodiment of the invention.

One embodiment of a data center 100 cooling one or more servers 105 is illustrated in FIG. 1, which shows a side view of the airflow through data center 100 that is capable of cooling the servers 105 without depending on fans within the servers 105. The arrows shown in FIG. 2 indicate the flow of air throughout the data center 100. A cooling system 130 is coupled to a cold air supply 115 and to an exhaust unit 125. While FIG. 1 shows a single cold air supply 115 and a single exhaust unit 125, other embodiments may have multiple cold air supplies 115 and/or multiple exhaust units 125. A load balancer 160 receives requests for processing from one or more clients and communicates the requests to one or more servers 105 for processing. A control system 150 is coupled to the load balancer 160 and to the exhaust unit 125, allowing data from the load balancer 160 to modify control signals communicated to the exhaust unit 125.

In one embodiment, a cold aisle 110 is adjacent to a first side of a partition 102 and a hot aisle 120 is adjacent to a second side of the partition 102. In an embodiment, the partition 102 includes one or more servers 105 oriented so that a first side of the one or more servers 105 is adjacent to the cold aisle 110 and a second side of the one or more servers 105 is adjacent to the hot aisle 120. The cold aisle 110 includes a cold air supply 115 while, in an embodiment, the hot aisle 120 includes one or more exhaust units 125. Additionally, one or more sensors 117 proximate to one or more servers server 105, are included in the cold aisle 110 and in the hot aisle 120.

The partition 102 includes one or more openings though which air is able to flow. In an embodiment, the partition 102 comprises a rack or other structure to which one or more devices, such as one or more servers 105 or other electronic devices, may be attached. For example, the one or more servers 105 are mounted to one or more racks and the one or more servers 105 may have different sizes, such as 1 to 12 rack units ("U"). The partition 102 is designed to increase airflow through the servers 105 included within the partition 102. For example, the partition 102 includes a server rack that is designed to increase the amount of air directed through the servers 105 included in the rack.

A server 105 has one or more input openings on a first side and one or more output openings on a second side. A server 105 is oriented so the one or more input openings are adjacent to the cold aisle 110 and the one or more output openings are adjacent to the hot aisle 120. Air from the cold aisle 110 enters the server 105 via the one or more input openings, travels through the server 105 and exits the server through the one or more output openings into the hot aisle 120. Hence, the input and output openings allow air to travel through the server 105 to cool components included in the server 105. In another embodiment, the system further includes air ducts configured to direct the cold air over the hot server components.

Cold air is supplied to the cold aisle 110 from a cold air supply 115, such as a large fan or other air distribution device. In an embodiment, the cold air supply 115 is coupled to a cooling system 130, further described below. As used herein, "cold air" may refer to air having a temperature less than an ambient air temperature, air having a temperature below a specified temperature, or air having a lower relative temperature than air in a different region. For example, air included in the cold aisle 110, referred to as "cold air," has a first temperature, while air included in the hot aisle 120, referred to as "hot air," has a second temperature that is higher than the first temperature. In different embodiments, the position of the cold air supply 115 relative to the cold aisle 110 may differ. For example, the cold air supply 115 may be positioned above, below, or to the side of the cold aisle 110. Additionally, in some embodiments, multiple cold air supplies 115 provide cold air to the cold aisle 110 and may have different positions relative to the cold aisle 110. For example, cold air supplies 115 are positioned above and below or below and to the side of the cold aisle 110. For purposes of illustration, FIG. 1 shows an implementation with a cold air supply 115 positioned above the cold aisle 110. By receiving cold air from the cold air supply 115, the cold aisle 110 has a higher pressure than the hot aisle 120. This pressure difference causes cold air to flow from the higher pressure cold aisle 110 through the one or more input openings of a server 105, or of the partition 102, to the lower pressure hot aisle 120.

The cooling system 130 comprises a Heating, Ventilating and Air Conditioning ("HVAC") system, which extracts heat from air. For example, the cooling system 130 uses free-air cooling, such as air-side or liquid-side economization to cool the air. In an embodiment, the cooling system 130 also includes secondary cooling systems, such as an evaporative cooling system, an absorption cooling system, an adsorption cooling system, a vapor-compression cooling system, or another cooling system to extract additional heat from air. In another embodiment, the cooling system 130 also modifies the humidity of the cool air to improve reliability and/or longevity of the servers 105 being cooled. For example, the cooling system 130 produces cold air having a humidity within a specified range, such as 20% to 60% humidity, to the cold aisle 110. In certain conditions, increasing the humidity may also reduce the temperature of the air.

One or more exhaust units 125 are included in the hot aisle 120 to extract air from the hot aisle 120 and to direct air from the hot aisle 120 outside of the data center 100. In one embodiment, the one or more exhaust units 125 direct air from the hot aisle 120 to the cooling system 130, where the heated air is again cooled. Hence, the one or more exhaust units 125 may implement a closed-loop where air is cooled by the cooling system 130 and recirculated to the cold aisle 110 via the cold air supply 115. Alternatively, cold air enters the hot aisle 120 and is directed outside of the data center 100 by the one or more exhaust units 125. In an embodiment, the hot aisle 120 includes one or more exhaust units 125, such as exhaust fans, which extract air from the hot aisle 120. While FIG. 1 shows an example hot aisle 120 with one exhaust unit 125, in other embodiments, the hot aisle may include a different number of exhaust units 125.

The one or more exhaust units 125 receive control signals from a control system 150. The control signals modify one or more operating characteristics of the one or more exhaust units 125 to modify the pressure difference between the cold aisle 110 and the hot aisle 120. For example, in response to receiving a control signal from the control system 150, an exhaust fan operates at a higher speed to extract more heated air from the hot aisle 120 and increase the pressure difference between the cold aisle 110 and the hot aisle 120. As another example, responsive to receiving a second control signal from the control system 150, the exhaust fan operates at a lower speed to extract less heated from the hot aisle 120 and decrease the pressure difference between the cold aisle and the hot aisle 120. By modifying operation of one or more exhaust units 125, the control system 150 is able to modify the amount of air travelling through the one or more servers 105 and/or the partition 102 by adjusting the pressure drop between the cold aisle 110 and the hot aisle 120. The control system 150 may also modify the operation of the fan driving the cold air supply 115. Moreover, the system need not have fans on both the cold aisle 110 and the hot aisle 120, as a single fan on either side may create sufficient pressure to cause the air to flow the servers. In such a case, the control system 130 may drive this single fan.

The load balancer 160 is coupled to the exhaust unit 125 and also communicates with a plurality of servers 105. Additionally, the load balancer 160 receives requests from one or more computing devices and communicates the received requests to one or more servers 105. For example, the load balancer 160 receives requests from a computing device for a server 105 to process data, requests from a computing device for a server 105 to retrieve data, requests from a computing device for a server 105 to store data or other requests for a server 105 to manipulate or modify data. The load balancer 160 also includes data includes data associating a number of requests for processing by a server 105, or a server "workload" with a pressure difference between the cold aisle 110 and the hot aisle 120. For example, data stored in the load balancer 160 identifies a maximum number of requests capable of being processed by a server 105 for a pressure difference between the cold aisle 110 and the hot aisle 120. The maximum number of requests indicates the number of requests which can be processed by a server 105 at a specific pressure difference without increasing the temperature of a server 105 beyond a threshold temperature or without increasing the temperature of the server 105 by a threshold amount. For example, the load balancer 160 includes a table associating a server workload with a pressure difference for each server 105 in the data center 100. In a different embodiment, the load balancer includes a table associating a server workload with a pressure difference for different types, or groups, of servers 105 included in the data center 100. If organized into groups, the servers 105 may be selected for a group wherein the servers 105 in a group generate the same amount of heat for a given load.

In one embodiment, the load balancer 160 receives the pressure difference between the cold aisle 110 and the hot aisle 120 from one or more sensors 117 in the hot aisle 120 and in the cold aisle 110. Alternatively, the load balancer 160 receives an absolute pressure of the cold aisle 110 from a sensor 117 included in the cold aisle 110 and an absolute pressure of the hot aisle 120 from a sensor 117 included in the hot aisle 120 and calculates the pressure difference between the cold aisle 110 and the hot aisle 120. In a typical server, there may be a correlation between the server work load and the power consumed by the server, as well as a correlation between the air flow through the server, or the pressure differential across the server, and the ability to remove a given amount of heat from the server.

Based on the pressure difference, the load balancer 160 determines from the stored data the maximum number of requests a server 105 is capable of processing and directs requests to different servers 105 based on the maximum number of requests a server 105 is capable of processing based on the pressure difference. For example, the load balancer directs requests to different servers 105 so that each server processes the same number of requests or so that the workload of various servers 105 is maximized with respect to the pressure difference. Hence, the load balancer 160 maximizes the amount of work done by different servers 105 for a specified pressure difference between the cold aisle 110 and the hot aisle 120. By distributing requests to different servers 105 based on the pressure difference between the cold aisle 110 and the hot aisle 120, the load balancer 160 regulates the workload of different servers 105 to reduce temperature variations between different servers 105. This increases the efficiency with which different servers 105 are cooled for a specific pressure difference between the cold aisle 110 and the hot aisle 120. Operation of the load balancer 160 to regulate server 105 load is further described below in conjunction with FIGS. 2A and 2B.

The coupling between the load balancer 160 and the control system 150 allows the load balancer 160 to modify operation of one or more exhaust units 125. For example, as the workload of various servers 105 increases beyond the maximum server workload for a first pressure difference, the load balancer 160 causes the control system 150 to generate a control signal increasing the amount of air that the exhaust unit 125 draws out of the hot aisle 120, which increases the pressure difference between the cold aisle 110 and the hot aisle 120. By modifying operation of the exhaust unit 125 in response to increases in server workload, the load balancer 160 allows dynamic modification of server cooling 105.

In one embodiment, the cooling system 130 receives heat from the exhaust units 125 included in the hot aisle 120, cools and dehumidifies the received air, and supplies the cooled and dehumidified air to the cold air supply 115 which supplies the cooled and dehumidified air to the cold aisle 110. In this embodiment, the cooling system 130 may be a closed system which recirculates air from the hot aisle 120 to the cold aisle 110 once the air is cooled and dehumidified. Cooled air travels from the cooling system 130 to the cold air supply 115, which supplies the cold air to the cold aisle 110. In an embodiment, the cold air supply 115 comprises one or more fans or one or more air nozzles, one or more air jets, or other device for directing air flow.

Cooled air from the cold air supply 115 enters the cold aisle 110. Because the cold aisle 110 has a higher pressure than the hot aisle 120, and the partition 102 includes one or more openings for air flow, the cold air flows from the cold aisle 110 to the lower pressure hot aisle 120. To flow from the cold aisle 110 to the hot aisle 120, the cold air passes through the openings in the partition 102, so that the cold air is drawn through the partition 102. In an embodiment, the partition 102 includes one or more servers 105 having one or more input openings on a first side adjacent to the cold aisle 110 and one or more output openings on a second side adjacent to the hot aisle 120. The input openings allow cold air to enter the server 105, travel through the server 105, flowing over components within the server 105. After traveling through the server 105, the output openings enable air to exit the server 105 into the hot aisle 120.

As cool air travels through the partition 102 and/or a server 105 from the cold aisle 110 to the hot aisle 120, a portion of the air travels across, or through, one or more sensors 117 included in the cold aisle 110 and in the hot aisle 120. The sensors 117 monitor attributes of the airflow, such as air temperature, air humidity, absolute air pressure of the cold aisle 110, absolute air pressure of the hot aisle 120 or a pressure difference between the cold aisle 110 and the hot aisle 120. The sensors 117 communicate the monitored attributes to the control system 150 and/or the load balancer 160. The control system generates a control signal modifying operation of the cold air supply 115 and/or the cooling system 210 to modify the cold air supplied to the cold aisle 110. For example, responsive to a sensor 117 detecting a temperature above a threshold value, an air flow below a threshold flow rate or a pressure difference between the cold aisle 110 and the hot aisle 120 falling below a threshold value, the control system generates a control signal increasing the rate or direction at which the cold air supply 115 supplies cold air to the cold aisle 110 or generates a control signal directing cold air from the cold air supply 115 towards certain areas in the cold aisle 110 needing increased cooling. For example, the control signal causes the cold air supply 115 to more cold air towards a region of the partition 102 where a sensor 117 indicates a temperature above a threshold value or an airflow rate below a threshold value. Alternatively, the control system generates a control signal causing the cooling system 210 to further reduce the temperature of the air provided to the cold aisle 110.

In an embodiment, the partition 102 is configured so that air flow paths external to the servers 105 are substantially blocked such that the airflow path of least resistance from the cold aisle 110 to the hot aisle 120 is through the servers 105. Configuring the partition 102 so that the airflow path of least resistance is through the servers 105 allows more efficient server 105 cooling by increasing the amount of air passing through the servers 105. In another embodiment, the partition 102 blocks substantially all airflow from the cold aisle 110 to the hot aisle 120 except for the airflow through the servers 105, so that substantially all of the airflow from the cold aisle 110 to the hot aisle 120 is through the servers 105. To facilitate airflow from the cold aisle 110 to the hot aisle, in one embodiment the cold aisle 110 may be pressurized while the hot aisle 120 is depressurized to facilitate airflow from the cold aisle 110 to the hot aisle 120. As the cold air passes through the server 105, it flows over components within the server 105, dissipating heat generated from operation of the electric components in the servers 105.

In different embodiments, the cold air supply 115 may statically or dynamically control the amount of air supplied to the cold aisle 110 to modify the airflow through the servers 105. In an embodiment where the air supply is statically controlled, the cold air supply 115 is louver-based and supplies cold air in different directions, at different flow rates, and/or at different temperature levels. In an alternative embodiment, the cold air supply 115 dynamically modifies the airflow supplied to the cold aisle 110 by changing the speed of one or more supply fans, repositioning one or more air supply louvers (or otherwise redirecting the airflow), or changing the temperature to which the airflow is cooled. Modifying the supply fan speed, supply louver position, and/or air temperature allows the cold air supply 115 to more suitably cool the servers 105 included in the partition 102. Hence, implementations of the cold air supply 115 allow non-uniform air flow and/or air temperature throughout the cold aisle 110, enabling different locations within the cold aisle 110, such as locations proximate to different servers 105, to have a different air flow rate and/or a different air temperature. Additionally, the air flow from the cold air supply 115 may be determined or modified based on the size of the servers 105 being cooled.

After flowing through the servers 105, cold air enters the hot aisle 120 because it has a lower pressure than the cold aisle 110. Because the air extracts heat from components within one or more servers 105, when passing from the cold aisle 110 to the hot aisle 120, the air temperature increases so that air in the hot aisle 120 has a higher temperature than air in the cold aisle 110.

The data center 100 also includes one or more sensors 117 in locations where air flows from the cold aisle 110 to the hot aisle 120. The sensors 117 monitor air flow, air temperature, air humidity, absolute air pressure, differential air pressure, or any other data that describes air flow or air temperature, and combinations thereof. In an embodiment, the sensors 117 are placed in locations where airflow is likely to be less than other locations, such as a ceiling or a wall where the partition 102 abuts another surface, so that the temperature of the sensor locations is likely to be higher than other locations. For example, sensors 117 are placed in various locations in the cold aisle 110 to monitor airflow through these locations, the temperature of these locations, the pressure difference between the cold aisle 110 and the hot aisle 120 or another value characterizing air flow through the sensor location. In another embodiment, sensors 117 are positioned at locations within the cold aisle 110, at locations within the hot aisle 120, at locations within one or more servers 105 or in any combination of the above-described locations.

The sensors 117 communicate with a control system coupled to, or included in, the cooling system and/or the cold air supply 115 to modify how air is cooled by the cooling system or how cold air is supplied to the cold aisle 110 by the cold air supply 115. The control system generates a control signal responsive to data from one or more sensors 117 to modify operation of the cooling system and/or the cold air supply 115. For example, responsive to detecting a temperature reaching a threshold value, an air flow reaching a threshold flow rate, or a pressure difference between the cold aisle 110 and the hot aisle 120 falling below a threshold value, a sensor 117 communicates with the control system, which generates a control signal increasing the rate at which the cold air supply 115 supplied to the cold aisle 110 or modifying the direction in which cold air is supplied to the cold aisle 110 by the cold air supply 115. Hence, the sensors 117 and control system implement a feedback loop allowing the data center 100 to modify how cold air flows through the servers 105 responsive to changes in the data center environment, improving the cooling efficiency.

Because the pressure differential between cold aisle 110 and hot aisle 120 causes air to flow through the partition 102, and electronic devices included in the partition 102, electronic devices included in the data center 100 are cooled without relying on air moving devices, such as fans, operating at individual electronic devices. Additionally, reducing the use of locally-implemented air moving devices reduces power consumption of the electronic devices, making the data center 100 more power efficient. This is due, at least in part, to the increased efficiency of the larger fans as compared to the smaller fans typically found in servers.

Server Load Balancing

Figures 2A, 2B:
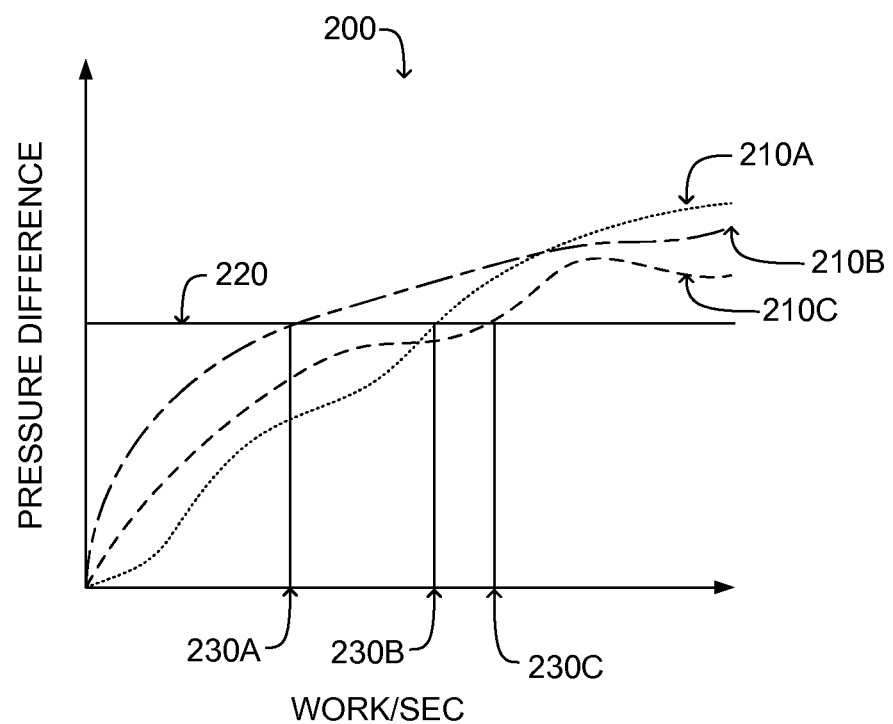
FIG. 2A is a tabular example of data included by a load balancer for a server associating a pressure difference with a server workload in accordance with an embodiment of the invention.
FIG. 2B is a graphical example of using data included by a load balancer to determine a workload for different servers based on a pressure difference in accordance with an embodiment of the invention.

By modifying the workload of various servers 105 within a data room 110, a load balancer 160 dynamically adjusts the number of requests processed by various servers to avoid large variations in the temperature of different servers which reduces or eliminates the need for internal fans to cool the server 105, at least under normal operating conditions. For multiple servers in the data room 110, the load balancer includes data associating a number of requests for processing by a server 105, or a "server workload," with a pressure difference between a cold aisle 110 and a hot aisle 120 in the data room 100. FIG. 2A shows one example of a load balancing table 200 maintained by the load balancer 160. In one embodiment, the load balancer 160 includes a load balancing table 200 associated with each server 105 in a data room 100, allowing modification of individual server workload. In another embodiment, the load balancer 160 includes load balancing tables 200 associated with various groupings of servers, so that the workload of different groups of servers is modified by the load balancer 160. For example, different load balancing tables 200 are associated with different types or configurations of servers, allowing modification of the workload of multiple types or configurations of servers.

For purposes of illustration, the example load balancing table 200 shown in FIG. 2A associates a pressure difference between the cold aisle 110 and the hot aisle 120 with a server workload, such as a number of requests per second. This allows the load balancing table 200 to identify a maximum server workload for a particular pressure difference. Each entry in the load balancing table 200 identifies a maximum server workload for a specified pressure difference. When the load balancer 160 receives a pressure difference from one or more sensors 117, the load balancer 160 determines the maximum workload for a server 105 at the received pressure difference and directs requests to different servers 105 based on the maximum server workload for the received pressure difference. For example, the load balancer 160 allocates received requests to different servers 105 so that multiple servers 105 operate at their maximum workload for the received pressure difference. For purposes of illustration, the example load balancing table 200 shown in FIG. 2A includes data associated with a single server 105; however, in other embodiments, the load balancing table 200 may include data associated with different groups of servers. For example, the load balancing table 200 may include data associated with different models, or types, of servers.

As shown in the example of FIG. 2A, in addition to data associating workload with a pressure difference, the load balancing table 200 may also include additional data. For example, the load balancing table 200 may identify the server power and the cubic feet per minute of air flowing from the cold aisle 110 to the hot aisle 120 at different pressure differences. This additional information may be used to determine server 105 and/or data room 100 characteristics at various combinations of server workloads and data room pressure differences.

FIG. 2B graphically illustrates use of the load balancing table 200 to determine server workload based on the pressure difference between the cold aisle 110 and the hot aisle 120 of the data room 110. For purposes of illustration, FIG. 2B shows a graph illustrating server workload against pressure difference is shown for three servers 210A, 210B, 210C. After receiving data describing a pressure difference 220 between the cold aisle 110 and the hot aisle 120 from one or more sensors 117 in the data room 100, the load balancer 160 identifies server workloads associated with the pressure difference 220. As shown in FIG. 2B, at the pressure difference 220, a first server 210A has a first maximum workload 230 while a second server 210B and a third server 210B have a second maximum workload 230B and a third maximum workload 230C, respectively. Based on the maximum workload 230A, 230B, 230C of the servers 210A, 210B, 210C, the load balancer 160 allocates requests to each of the servers 210A, 210B, 210C. For example, based on the maximum workload 230A, 230B, 230C, the load balancer 160 modifies the workload of each server 210A, 210B, 210C so that each server operates at, or near, the maximum workload 230A, 230B, 230C. In one embodiment, the load balancer 160 directs received requests to the servers 210A, 210B, 210C to increase the number of requests processed by each server 210A, 210B, 210C until each server 210A, 210B, 210C is operating at its maximum workload 230A, 230B, 230C. For example, the load balancer 160 directs requests to the first server 210A until the a first server 210A is operating at its maximum workload 230A or at a fraction of its maximum workload 230A then directs requests to the second server 210B or the third server 230C. In the example of FIG. 2B, at the pressure difference 220, the third workload 230C of the third server 210C is larger than the first workload 210A of the first server 210A, allowing the third server 210C to process more requests at the pressure difference 220. This allows the load balancer 160, at the pressure difference 220, to allocate requests so that the third server 210C receives a greater number of requests than the first server 210A. Thus, by modifying the server 210A, 210B, 210C used to process requests, the load balancer 160 allows each server 210A, 210B, 210C to operate at maximum performance by maximizing the number of requests processed by each server 210A, 210B, 210C at a particular pressure difference 220.

In one embodiment, when each server 210A, 210B, 210C is processing the maximum number of requests at a pressure difference 220 and the load balancer 160 receives additional requests, the load balancer 160 communicates a control signal to the control system 150 so that the exhaust unit 125 draws more heated air from the hot aisle 120. This increases the pressure difference between the cold aisle 110 and the hot aisle 120. Pressure in the cold aisle 110 may also be increased by increasing the supply of air from the cold air supply 115.

Based on the increased pressure difference, the load balancer 160 allocates the additional requests so that different servers 210A, 210B, 210C have their maximum workload at the increased pressure difference.

SUMMARY

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium, which include any type of tangible media suitable for storing electronic instructions, and coupled to a computer system bus. Furthermore, any computing systems referred to in the specification may include a single processor or may be architectures employing multiple processor designs for increased computing capability.

Embodiments of the invention may also relate to a computer data signal embodied in a carrier wave, where the computer data signal includes any embodiment of a computer program product or other data combination described herein. The computer data signal is a product that is presented in a tangible medium or carrier wave and modulated or otherwise encoded in the carrier wave, which is tangible, and transmitted according to any suitable transmission method.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A data center system comprising:
   a partition arranged between a cold aisle on a first side of the partition and a hot aisle on a second side of the partition;
   a plurality of servers arranged in the partition so that each server has an input opening positioned on the first side of the partition in communication with the cold aisle and an output opening on the second side of the partition in communication with the hot aisle;
   an air supply unit, located external to the plurality of servers, configured to pressurize the cold aisle relative to the hot aisle, so that air flows from the cold aisle to the hot aisle through the servers;
   one or more exhaust units external to the plurality of servers configured to extract air from the hot aisle;
   a load balancer coupled to a plurality of servers and to a control unit which is coupled to the one or more exhaust units, the load balancer configured to receive data from one or more sensors at each of a plurality of locations proximate to one or more servers describing a pressure difference between the cold aisle and the hot aisle, receive requests for processing by one or more servers and the load balancer including computer program code stored on a memory and configured to be executed by the processor, the computer program code including instructions for:
      determining a maximum workload associated with each server based on the received pressure differences,
      allocating the requests to various servers based on the maximum workload associated with each server based on the received pressure differences,
      responsive to determining that a subset of the servers are operating at the maximum workload based on the pressure differences, operating an air supply unit, located external to the plurality of servers, to increase the pressure of the cold aisle relative to the hot aisle,
      determining an increased workload of the plurality of servers based on the increased pressure of the cold aisle relative to the hot aisle, and
      allocating data requests to different servers based on the maximum workload associated with each server based on the increased pressure of the cold aisle relative to the hot aisle.

2. The data center system of claim 1, wherein allocating the requests to various servers based on the maximum workload associated with each server based on the received pressure differences comprises:
   allocating the requests to various servers so that a server operates at the maximum workload associated with the server for the received pressure differences.

3. The data center system of claim 1, wherein the load balancer communicates a signal to the control system to increase the amount of air extracted from the hot aisle by the exhaust system responsive to determining that a subset of servers are operating at their maximum workload for the pressure differences.

4. The data center of claim 1, wherein the load balancer includes a plurality of load balancing tables, each load balancing table associated with one or more servers and including data associating a maximum workload with each of a plurality of pressure differences.

5. The data center of claim 4, wherein each load balancing table is associated with a type of server.

6. The data center system of claim 1, further comprising a cooling system coupled to the air supply unit and to the one or more exhaust units, the cooling system receiving air from the one or more exhaust units, extracting heat from the air having the second temperature to generate cold air and supplying the cold air to the air supply unit.

7. The data center system of claim 1 where the one or more sensors proximate to one or more servers also capture data describing an attribute of airflow through locations proximate to the one or more servers.

8. The data center system of claim 7, wherein the attribute of airflow is at least one of an airflow rate and a temperature.

9. The data center system of claim 1, wherein the one or more sensors are positioned at locations along the partition.

10. The data center of claim 1, wherein the partition substantially blocks airflow paths from the cold aisle to the hot aisle external to the plurality of servers, directing air from the cold aisle into the input opening of each server.

11. A data center system comprising:
   a partition arranged between a cold aisle on a first side of the partition and a hot aisle on a second side of the partition;
   a plurality of servers arranged in the partition, each server comprising:
      one or more input openings on the first side of the partition in communication with the cold aisle;
      one or more output openings on the second side of the partition in communication with the hot aisle;
   an air supply unit located external to the plurality of servers configured to pressurize the cold aisle relative to the hot aisle so that air flows from the cold aisle to the hot aisle through the servers;
   one or more sensors in locations along the partition and coupled to a control system coupled to the air supply unit, the one or more sensors configured to monitor a pressure difference at each of a plurality of locations between the first side of the partition and the second side of the partition and the control system generating a control signal modifying the pressure difference; and
   a load balancer coupled to the plurality of servers and to the control unit, the load balancer configured to receive data from the one or more sensors describing the monitored pressure differences, receive requests for processing by one or more servers and the load balancer including computer program code stored on a memory and configured to be executed by a processor, the computer program code including instructions for:
      determining a maximum workload associated with each server based on the pressure differences,
      allocating the requests to various servers based on the maximum workload associated with each server based on the pressure differences,
      responsive to determining that a subset of the servers are operating at the maximum workload based on the pressure differences, operating an air supply unit, located external to the plurality of servers, to increase the pressure of the cold aisle relative to the hot aisle,
      determining an increased workload of the plurality of servers based on the increased pressure of the cold aisle relative to the hot aisle, and
      allocating data requests to different servers based on the maximum workload associated with each server based on the increased pressure of the cold aisle relative to the hot aisle.

12. The data center system of claim 11, wherein allocating the requests to various servers based on the maximum work load associated with each server based on the pressure differences comprises:

allocating the requests to various servers so that each server operates at the maximum workload associated with a server for the monitored pressure differences.

13. The data center system of claim 11, further comprising one or more exhaust units external to the plurality of servers and coupled to the control system, the one or more exhaust units configured to extract air from the hot aisle.

14. The data center system of claim 13, wherein the load balancer communicates a signal to the control system to increase the amount of air extracted from the hot aisle by the exhaust system responsive to determining that a subset of servers are operating at their maximum workload for the monitored pressure differences.

15. The data center of claim 11, wherein the load balancer includes a plurality of load balancing tables, each load balancing table associated with one or more servers and including data associating a maximum workload with each of a plurality of pressure differences.

16. The data center of claim 15, wherein each load balancing table is associated with a type of server.

17. A method for modifying server workload in a data center, the method comprising:

operating a plurality of servers, the servers arranged in a partition so that each server has an input opening positioned on a first side of the partition in communication with a cold aisle and an output opening on a second side of the partition in communication with a hot aisle;

isolating the cold aisle and the hot aisle using the partition, so that an airflow path of least resistance from the cold aisle to the hot aisle is through the servers;

pressurizing the cold aisle relative to the hot aisle using a supply of air external to the servers, so that air flows from the cold aisle to the hot aisle through the servers;

determining a pressure difference at each of a plurality of locations between the cold aisle and the hot aisle;

determining a maximum workload of a plurality of servers based on the pressure differences;

allocating data requests to various servers based on the maximum workload associated with each server based on the pressure differences;

responsive to determining that a subset of the servers are operating at the maximum workload based on the pressure differences, operating an air supply unit, located external to the plurality of servers, to increase the pressure of the cold aisle relative to the hot aisle;

determining an increased workload of the plurality of servers based on the increased pressure of the cold aisle relative to the hot aisle; and allocating data requests to different servers based on the maximum workload associated with each server based on the increased pressure of the cold aisle relative to the hot aisle.

18. The method of claim 17, wherein allocating the data requests to various servers based on the maximum workload associated with each server based on the pressure differences comprises:

allocating the data requests to different servers so that each server operates at the maximum workload based on the pressure differences.

19. The method of claim 17, wherein increasing the pressure of the cold aisle relative to the hot aisle comprises:

generating a control signal increasing the amount of air extracted from the hot aisle by an exhaust system.

20. A method for modifying server workload in a data center, the method comprising:

operating a plurality of servers, the servers arranged in a partition so that each server has an input opening positioned on a first side of the partition in communication with a cold aisle and an output opening on a second side of the partition in communication with a hot aisle;

isolating the cold aisle and the hot aisle using the partition, so that an airflow path of least resistance from the cold aisle to the hot aisle is through the servers;

pressurizing the cold aisle relative to the hot aisle using a supply of air external to the servers, so that air flows from the cold aisle to the hot aisle through the servers; and a step for determining a pressure difference between the cold aisle and the hot aisle;

a step for determining a maximum workload of a plurality of servers based on the pressure difference;

a step for allocating data requests to various servers based on the maximum workload associated with each server based on the pressure difference;

responsive to determining that a subset of the servers are operating at the maximum workload based on the pressure difference, operating an air supply, located external to the plurality of servers, to increase the pressure of the cold aisle relative to the hot aisle;

a step for determining an increased workload of the plurality of servers based on the increased pressure of the cold aisle relative to the hot aisle; and a step for allocating the data requests to different servers based on the maximum workload associated with each server based on the increased pressure of the cold aisle relative to the hot aisle.

21. The method of claim 20, wherein the step for allocating data requests to various servers based on the maximum workload associated with each server based on the pressure difference comprises:

a step for allocating the data requests to different servers so that each server operates at the maximum workload based on the pressure difference.

22. The method of claim 20, wherein the step for allocating the data requests to different servers based on the maximum workload associated with each server based on the increased pressure of the cold aisle relative to the hot aisle comprises:

a step for allocating data requests to different servers so that each server operates at the increased maximum workload based on the increased pressure of the cold aisle relative to the hot aisle.

* * * * *